United States Patent
Bauerschmidt et al.

(10) Patent No.: US 12,204,229 B2
(45) Date of Patent: *Jan. 21, 2025

(54) SUPERCONTINUUM RADIATION SOURCE AND ASSOCIATED METROLOGY DEVICES

(71) Applicant: ASML NETHERLANDS B.V., Veldhoven (NL)

(72) Inventors: Sebastian Thomas Bauerschmidt, Wendelstein (DE); Peter Maximilian Götz, Altdorf (DE); Patrick Sebastian Uebel, Marloffstein (DE)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 18/373,421

(22) Filed: Sep. 27, 2023

(65) Prior Publication Data

US 2024/0061314 A1 Feb. 22, 2024

Related U.S. Application Data

(63) Continuation of application No. 17/307,217, filed on May 4, 2021, now Pat. No. 11,774,828.

(30) Foreign Application Priority Data

May 19, 2020 (EP) ..................................... 20175307

(51) Int. Cl.
 *G02F 1/35* (2006.01)
 *G03F 9/00* (2006.01)
 (Continued)

(52) U.S. Cl.
 CPC .......... *G02F 1/3528* (2021.01); *G03F 9/7034* (2013.01); *H01S 3/0057* (2013.01); *H01S 3/06741* (2013.01)

(58) Field of Classification Search
 CPC .... G02F 1/3528; G02F 1/3515; G03F 9/7034; G03F 7/70616; G03F 9/7026;
 (Continued)

(56) References Cited

U.S. PATENT DOCUMENTS 6,952,253 B2 10/2005 Lof et al.
6,961,116 B2 11/2005 Den Boef et al.
(Continued)

FOREIGN PATENT DOCUMENTS

DE 102009056092 6/2011
EP 1628164 2/2006
(Continued)

OTHER PUBLICATIONS

Extended European Search Report issued in corresponding European Patent Application No. 21169501.0, dated Jul. 12, 2021.
(Continued)

*Primary Examiner* — Xinning (Tom) Niu
(74) *Attorney, Agent, or Firm* — Pillsbury Winthrop Shaw Pittman, LLP

(57) ABSTRACT

A supercontinuum radiation source including a modulator being operable to modulate pump laser radiation including a train of radiation pulses to provide modulated pump laser radiation, the modulation being such to selectively provide a burst of the pulses; and a hollow-core photonic crystal fiber being operable to receive the modulated pump laser radiation and excite a working medium contained within the hollow-core photonic crystal fiber so as to generate supercontinuum radiation.

20 Claims, 6 Drawing Sheets

(51) Int. Cl.
  *H01S 3/00* (2006.01)
  *H01S 3/067* (2006.01)

(58) Field of Classification Search
  CPC .... G03F 9/7046; G03F 9/7065; H01S 3/0057; H01S 3/06741; H01S 3/0085; H01S 3/0092; G02B 6/02328; G02B 6/4206
  See application file for complete search history.

(56) References Cited

U.S. PATENT DOCUMENTS

| | | | |
|---|---|---|---|
| 7,265,364 | B2 | 9/2007 | Teunissen et al. |
| 7,400,402 | B2 | 7/2008 | Smith |
| 7,646,471 | B2 | 1/2010 | Teunissen et al. |
| 8,339,595 | B2 | 12/2012 | Den Boef |
| 8,718,104 | B2 | 5/2014 | Clowes et al. |
| 8,786,825 | B2 | 7/2014 | Van De Kerkhof et al. |
| 8,830,472 | B2 | 9/2014 | Den Boef et al. |
| 8,842,293 | B2 | 9/2014 | Den Boef et al. |
| 8,891,061 | B2 | 11/2014 | Leewis et al. |
| 9,160,137 | B1 | 10/2015 | Abdolvand et al. |
| 9,606,442 | B2 | 3/2017 | Mathijssen et al. |
| 11,774,828 | B2 * | 10/2023 | Bauerschmidt ..... H01S 3/06741 372/6 |
| 2004/0015085 | A1 | 1/2004 | Soh et al. |
| 2007/0296960 | A1 | 12/2007 | Den Boef et al. |
| 2008/0198380 | A1 | 8/2008 | Straaijer et al. |
| 2009/0097512 | A1 * | 4/2009 | Clowes ................ H01S 3/0085 372/21 |
| 2009/0168062 | A1 | 7/2009 | Straaijer |
| 2010/0007863 | A1 | 1/2010 | Jordanoska |
| 2010/0177794 | A1 * | 7/2010 | Peng ..................... H01S 3/2316 372/25 |
| 2010/0233600 | A1 | 9/2010 | Den Boef et al. |
| 2010/0328655 | A1 | 12/2010 | Den Boef |
| 2011/0026032 | A1 | 2/2011 | Den Boef et al. |
| 2011/0032500 | A1 | 2/2011 | Straaijer |
| 2011/0102753 | A1 | 5/2011 | Van De Kerkhof et al. |
| 2011/0102793 | A1 | 5/2011 | Straaijer |
| 2011/0188020 | A1 | 8/2011 | Den Boef |
| 2011/0249244 | A1 | 10/2011 | Leewis et al. |
| 2012/0044470 | A1 | 2/2012 | Smilde et al. |
| 2012/0044495 | A1 | 2/2012 | Straaijer |
| 2013/0162996 | A1 | 6/2013 | Straaijer et al. |
| 2013/0177031 | A1 | 7/2013 | Almeida et al. |
| 2013/0188241 | A1 * | 7/2013 | Clowes ................ H01S 3/2308 359/326 |
| 2013/0208736 | A1 * | 8/2013 | Clowes ................ H01S 3/108 250/459.1 |
| 2013/0308142 | A1 | 11/2013 | Straaijer |
| 2014/0231679 | A1 | 8/2014 | Kremeyer et al. |
| 2015/0261097 | A1 | 9/2015 | Mathijssen et al. |
| 2016/0161863 | A1 | 6/2016 | Den Boef et al. |
| 2016/0370717 | A1 | 12/2016 | Den Boef et al. |
| 2017/0016815 | A1 | 1/2017 | Shchegrov et al. |
| 2017/0184981 | A1 * | 6/2017 | Quintanilha ......... G03F 7/70625 |
| 2017/0269482 | A1 * | 9/2017 | Boonzajer Flaes ... G03F 7/7065 |
| 2017/0307977 | A1 | 10/2017 | Godfried et al. |
| 2019/0319420 | A1 | 10/2019 | Max-Planck-Gesellschaft |

FOREIGN PATENT DOCUMENTS

| | | |
|---|---|---|
| EP | 3647874 | 5/2020 |
| TW | R201500785 | 1/2015 |
| WO | 2016102127 | 3/2016 |
| WO | 2017032454 | 3/2017 |
| WO | AAR2018127266 | 7/2018 |

OTHER PUBLICATIONS

Taiwanese Search Report issued in corresponding Taiwanese Patent Application No. 110116881, dated Mar. 3, 2022.

* cited by examiner

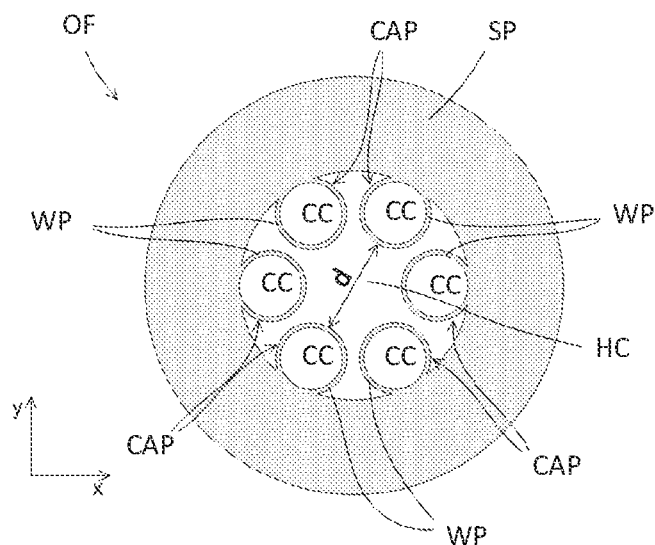
Fig. 7A
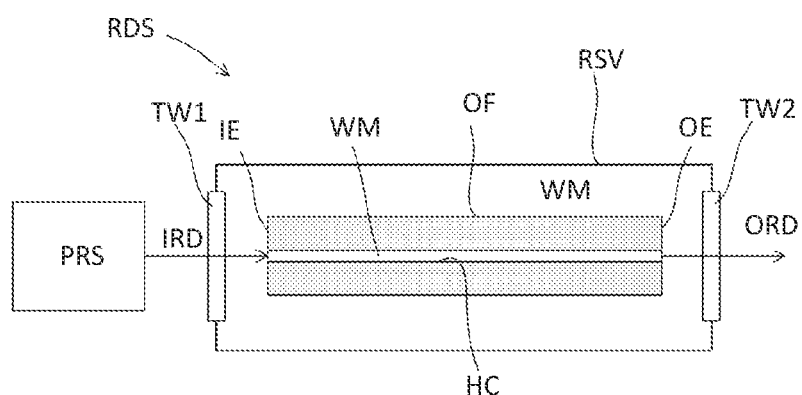
Fig. 7B
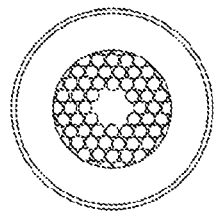 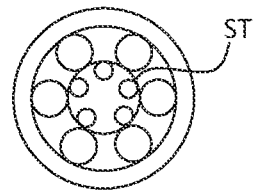
Fig. 7C          Fig. 7D

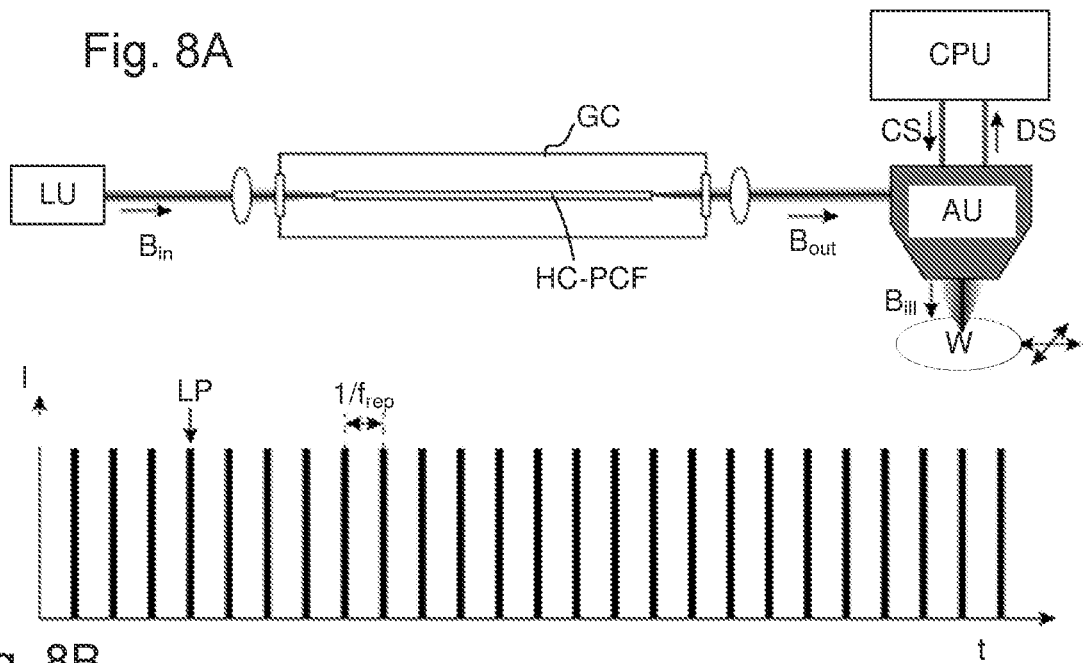
Fig. 8A
Fig. 8B
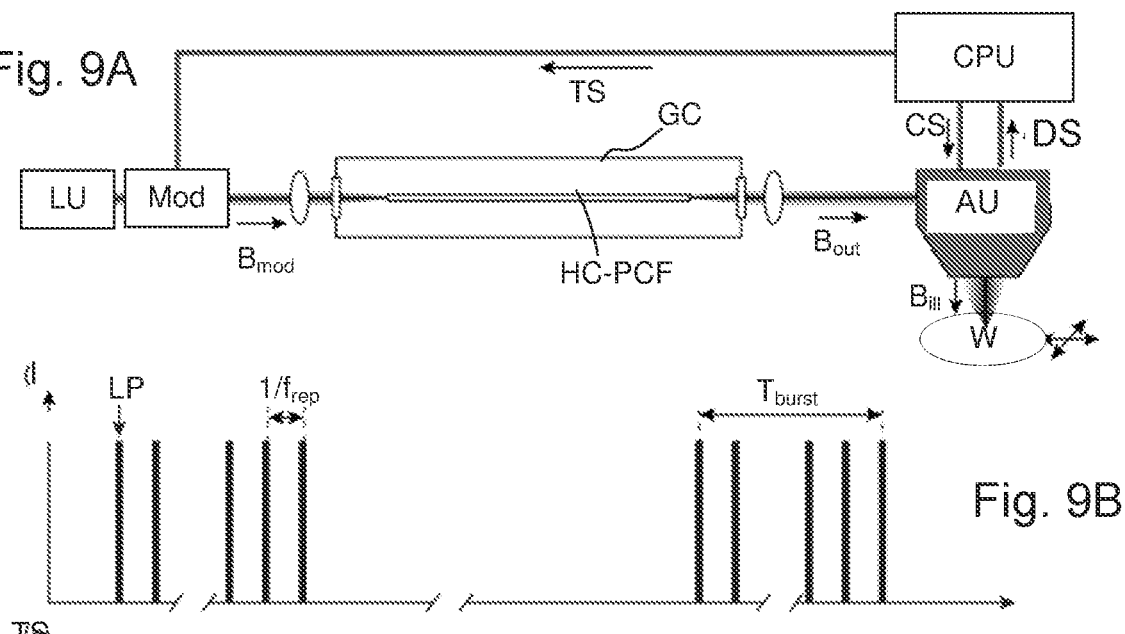
Fig. 9A
Fig. 9B
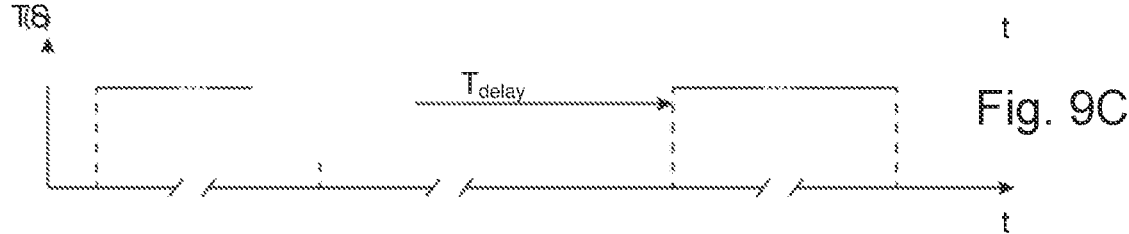
Fig. 9C

SUPERCONTINUUM RADIATION SOURCE AND ASSOCIATED METROLOGY DEVICES

This application is a continuation of U.S. patent application Ser. No. 17/307,217, filed May 4, 2021, which claims the benefit of priority to European patent application no. 20175307.6, filed May 19, 2020, each of the foregoing applications is incorporated herein in its entirety by reference.

FIELD

The present description relates to a hollow-core photonic crystal fiber based supercontinuum radiation source, and in particular such a supercontinuum radiation source in relation to metrology applications in the manufacture of integrated circuits.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1 \times A/NA$, where A is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

Metrology tools are used in many aspects of the IC manufacturing process, for example as an alignment tool for proper positioning of a substrate prior to an exposure, a leveling tool to measure a surface topology of the substrate, for e.g., focus control and a scatterometry based tool for inspecting/measuring the exposed and/or etched product in process control. In each case, a radiation source is typically used. For various reasons, including measurement robustness and accuracy, broadband or white light radiation sources are increasingly used for such metrology applications. It would be desirable to improve on present devices for broadband radiation generation.

SUMMARY

In an aspect, there is provided a supercontinuum radiation source comprising: a modulator being operable to modulate pump laser radiation comprising a train of radiation pulses to provide modulated pump laser radiation, the modulation being such to selectively provide a burst of the pulses; and a hollow-core photonic crystal fiber being operable to receive the modulated pump laser radiation and excite a working medium contained within the hollow-core photonic crystal fiber so as to generate supercontinuum radiation.

In an aspect, there is provided a metrology device comprising: a substrate support for supporting a substrate; a supercontinuum radiation source as described herein; an optical system operable to direct the supercontinuum radiation from the supercontinuum radiation source to the substrate; and a processor operable to generate a control signal for the modulator.

BRIEF DESCRIPTION OF THE DRAWINGS

Embodiments of the invention will now be described, by way of example only, with reference to the accompanying schematic drawings, in which:

FIG. 7A is a schematic cross-sectional view of a hollow core optical fiber that may form part of a radiation source according to an embodiment in a transverse plane (i.e. perpendicular to an axis of the optical fiber);

FIG. 7B depicts a schematic representation of a radiation source according to an embodiment for providing broadband output radiation; and FIGS. 7C and 7D schematically depict transverse cross-sections of examples of hollow core photonic crystal fiber (HC-PCF) designs for supercontinuum generation, which each may form part of a radiation source according to an embodiment;

FIG. 8A illustrates a metrology device and illumination source arrangement;

FIG. 8B shows a corresponding plot of pump radiation pulses against time for the metrology device and illumination source arrangement of FIG. 8A;

FIG. 9A illustrates a metrology device and illumination source arrangement according to an embodiment;

FIG. 9B shows a corresponding plot of a pump radiation pulses against time for the metrology device and illumination source arrangement of FIG. 9A; and FIG. 9C shows a corresponding plot of a trigger signal for control of a modulator.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
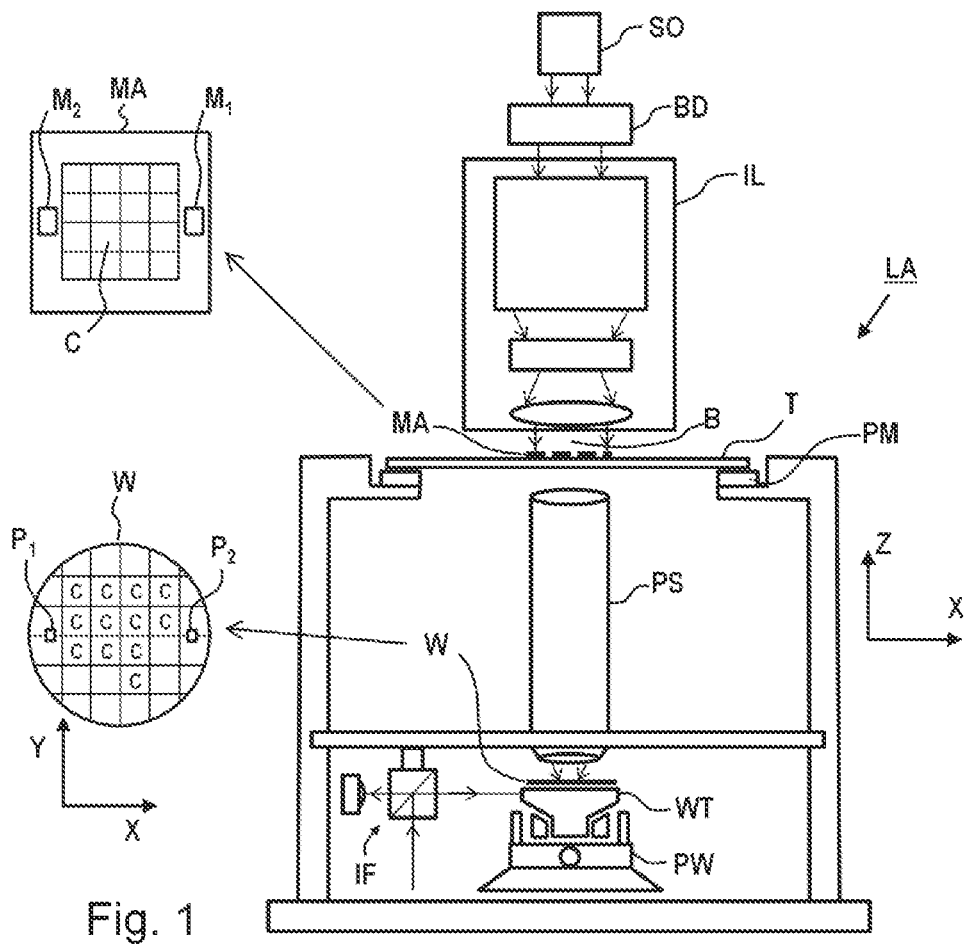
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
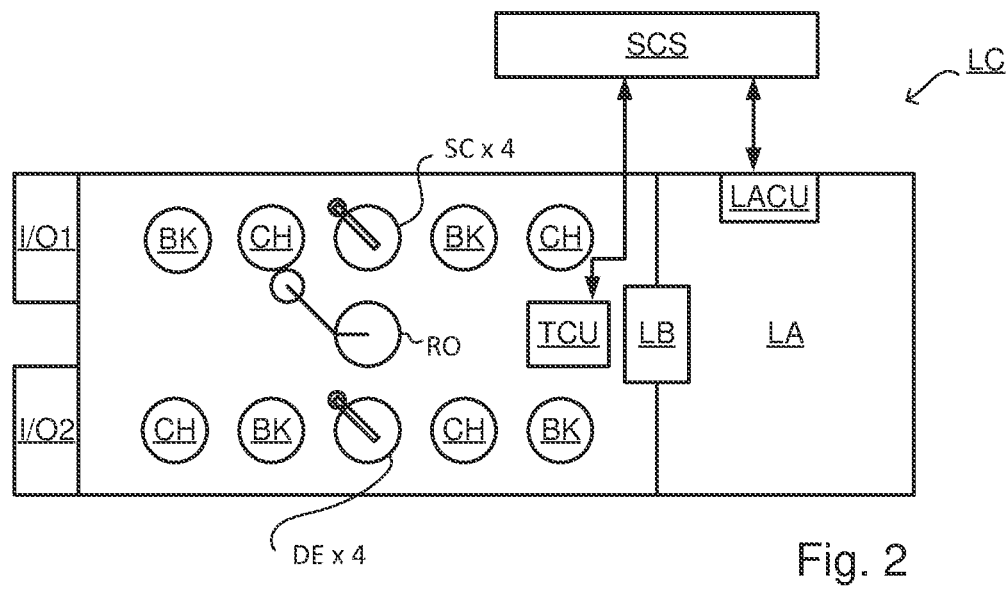
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
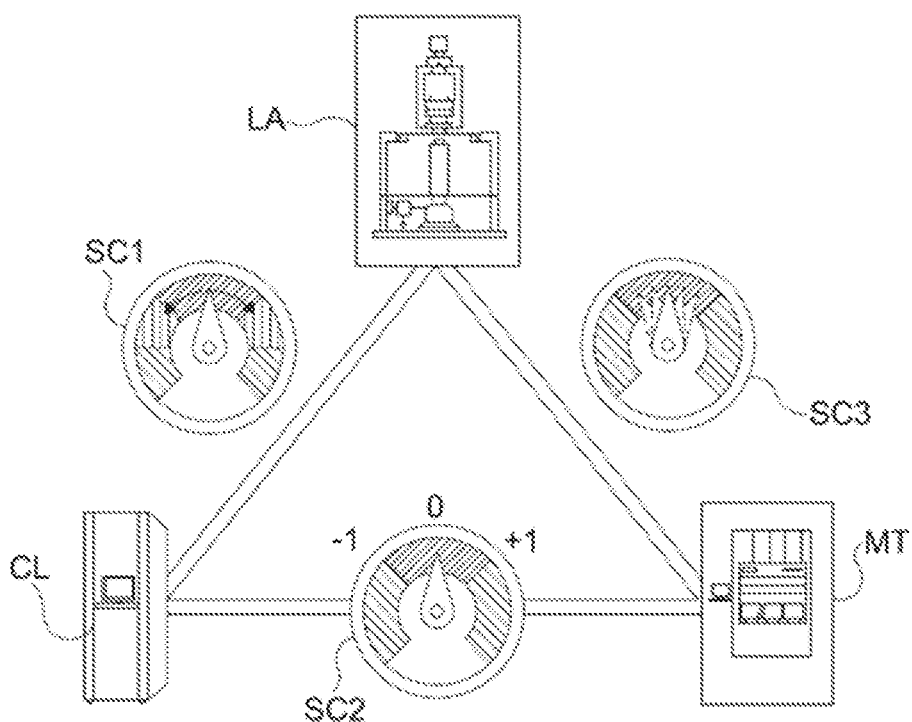
FIG. 3 depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

In lithographic processes, it is desirable to make frequently measurements of the structures created, e.g., for process control and verification. Tools to make such measurement are typically called metrology tools MT. Different types of metrology tools MT for making such measurements are known, including scanning electron microscopes or various forms of scatterometer metrology tools MT. Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in U.S. patent application publication nos. US 2010-0328655, US 2011-102753, US 2012-0044470, US 2011-0249244, US 2011-0026032 and European patent application publication no. EP1,628,164, each of the foregoing publications is incorporated herein in its entirety by reference. Aforementioned scatterometers may measure gratings using radiation from soft x-ray and visible to near-IR wavelength range.

In a first embodiment, the scatterometer MT is an angular resolved scatterometer. In such a scatterometer reconstruction methods may be applied to the measured signal to reconstruct or calculate properties of the grating. Such reconstruction may, for example, result from simulating interaction of scattered radiation with a mathematical model of the target structure and comparing the simulation results with those of a measurement. Parameters of the mathematical model are adjusted until the simulated interaction produces a diffraction pattern similar to that observed from the real target.

In a second embodiment, the scatterometer MT is a spectroscopic scatterometer MT. In such spectroscopic scatterometer MT, the radiation emitted by a radiation source is directed onto the target and the reflected or scattered radiation from the target is directed to a spectrometer detector, which measures a spectrum (i.e. a measurement of intensity as a function of wavelength) of the specular reflected radiation. From this data, the structure or profile of the target giving rise to the detected spectrum may be reconstructed, e.g. by Rigorous Coupled Wave Analysis and non-linear regression or by comparison with a library of simulated spectra.

In a third embodiment, the scatterometer MT is an ellipsometric scatterometer. The ellipsometric scatterometer allows for determining parameters of a lithographic process by measuring scattered radiation for each polarization states. Such metrology apparatus emits polarized radiation (such as linear, circular, or elliptic) by using, for example, appropriate polarization filters in the illumination section of the metrology apparatus. A source suitable for the metrology apparatus may provide polarized radiation as well. Various embodiments of existing ellipsometric scatterometers are described in U.S. patent application publication nos. 2007-0296960, 2008-0198380, 2009-0168062, 2010-0007863, 2011-0032500, 2011-0102793, 2011-0188020, 2012-0044495, 2013-0162996 and 2013-0308142, each incorporated herein its entirety by reference.

Figure 4:
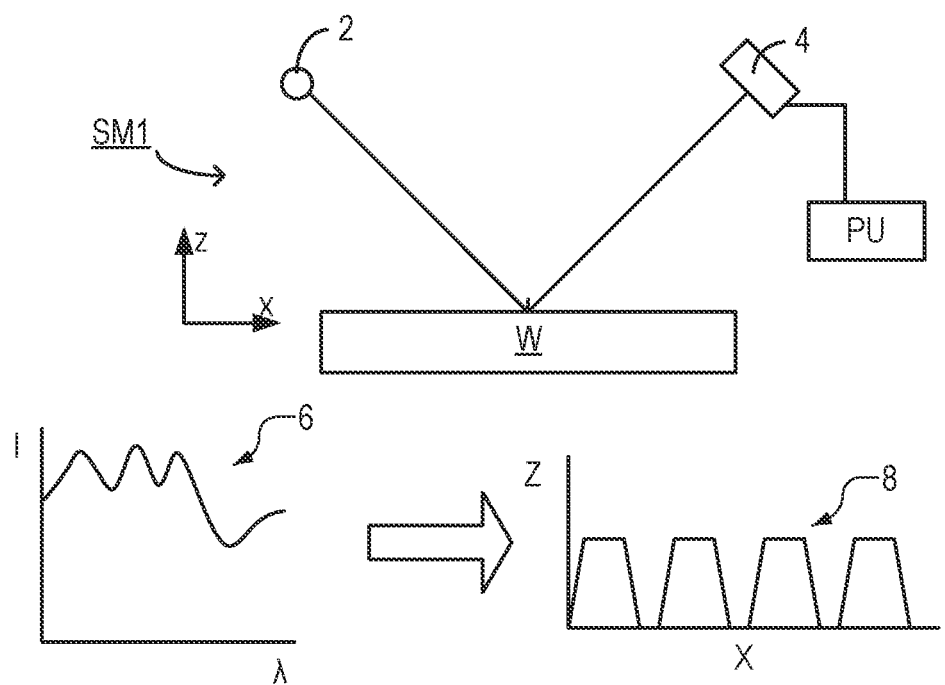
FIG. 4 depicts a schematic overview of a scatterometry apparatus used as a metrology device, which may comprise a radiation source according to embodiments of the invention.

A metrology apparatus, such as a scatterometer, is depicted in FIG. 4. It comprises a broadband (e.g., white light) radiation projector 2 which projects radiation onto a substrate W. The reflected or scattered radiation is passed to a spectrometer detector 4, which measures a spectrum 6 (i.e. a measurement of intensity as a function of wavelength) of the specular reflected radiation. From this data, the structure or profile 8 giving rise to the detected spectrum may be reconstructed by processing unit PU, e.g. by Rigorous Coupled Wave Analysis and non-linear regression or by comparison with a library of simulated spectra as shown at the bottom of FIG. 3. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Overall measurement quality of a lithographic parameter via measurement of a metrology target is at least partially determined by the measurement recipe used to measure this lithographic parameter. The term "substrate measurement recipe" may include one or more parameters of the measurement itself, one or more parameters of the one or more patterns measured, or both. For example, if the measurement used in a substrate measurement recipe is a diffraction-based optical measurement, one or more of the parameters of the measurement may include the wavelength of the radiation, the polarization of the radiation, the incident angle of radiation relative to the substrate, the orientation of radiation relative to a pattern on the substrate, etc. One of the criteria to select a measurement recipe may, for example, be a sensitivity of one of the measurement parameters to processing variations. More examples are described in U.S. patent application publication nos. US2016-0161863 and US 2016/0370717, each of which is incorporated herein in its entirety by reference.

Another type of metrology tool used in IC manufacture is a topography measurement system, level sensor or height sensor. Such a tool may be integrated in the lithographic apparatus, for measuring a topography of a top surface of a substrate (or wafer). A map of the topography of the substrate, also referred to as height map, may be generated from these measurements indicating a height of the substrate as a function of the position on the substrate. This height map may subsequently be used to correct the position of the substrate during transfer of the pattern on the substrate, in order to provide an aerial image of the patterning device in a properly focus position on the substrate. It will be understood that "height" in this context refers to a dimension broadly out of the plane to the substrate (also referred to as Z-axis). Typically, the level or height sensor performs measurements at a fixed location (relative to its own optical system) and a relative movement between the substrate and the optical system of the level or height sensor results in height measurements at locations across the substrate.

Figure 5:
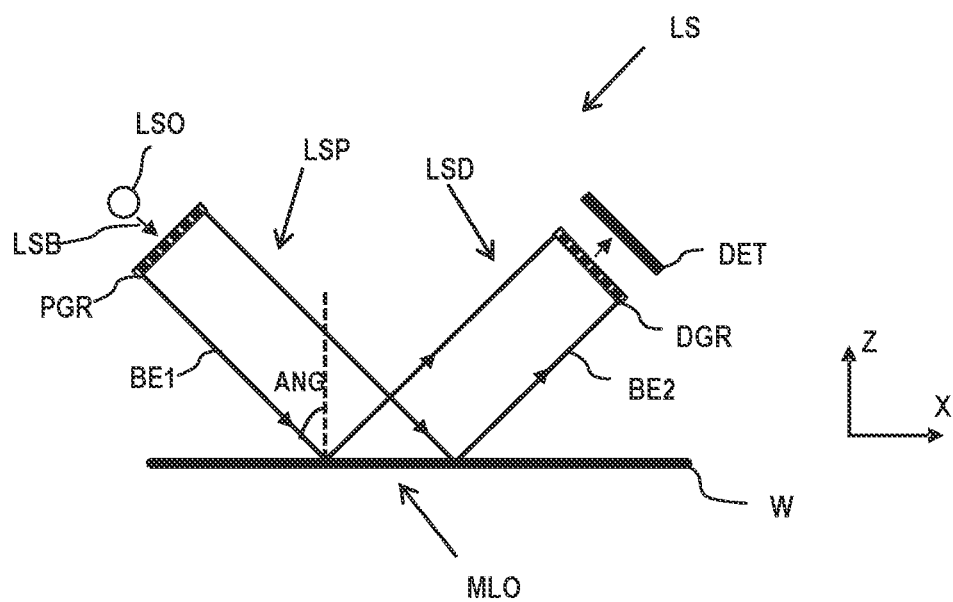
FIG. 5 depicts a schematic overview of a level sensor apparatus which may comprise a radiation source according to embodiments of the invention.

An example of a level or height sensor LS is schematically shown in FIG. 5, which illustrates only the principles of operation. In this example, the level sensor comprises an optical system, which includes a projection unit LSP and a detection unit LSD. The projection unit LSP comprises a radiation source LSO providing a beam of radiation LSB which is imparted by a projection grating PGR of the projection unit LSP. The radiation source LSO may be, for example, a narrowband or broadband radiation source, such as a supercontinuum radiation source, polarized or non-polarized, pulsed or continuous, such as a polarized or non-polarized laser beam. The radiation source LSO may include a plurality of radiation sources having different colors, or wavelength ranges, such as a plurality of LEDs. The radiation source LSO of the level sensor LS is not restricted to visible radiation, but may additionally or alternatively encompass UV and/or IR radiation and any range of wavelengths suitable to reflect from a surface of a substrate.

The projection grating PGR is a periodic grating comprising a periodic structure resulting in a beam of radiation BE1 having a periodically varying intensity. The beam of radiation BE1 with the periodically varying intensity is directed towards a measurement location MLO on a substrate W having an angle of incidence ANG with respect to an axis perpendicular (Z-axis) to the incident substrate surface between 0 degrees and 90 degrees, typically between 70 degrees and 80 degrees. At the measurement location MLO, the patterned beam of radiation BE1 is reflected by the substrate W (indicated by arrows BE2) and directed towards the detection unit LSD.

In order to determine the height level at the measurement location MLO, the level sensor further comprises a detection system comprising a detection grating DGR, a detector DET and a processing unit (not shown) for processing an output signal of the detector DET. The detection grating DGR may be identical to the projection grating PGR. The detector DET produces a detector output signal indicative of the radiation received, for example indicative of the intensity of the radiation received, such as a photodetector, or representative of a spatial distribution of the intensity received, such as a camera. The detector DET may comprise any combination of one or more detector types.

By means of triangulation techniques, the height level at the measurement location MLO can be determined. The detected height level is typically related to the signal strength as measured by the detector DET, the signal strength having a periodicity that depends, amongst others, on the design of the projection grating PGR and the (oblique) angle of incidence ANG.

The projection unit LSP and/or the detection unit LSD may include further optical elements, such as lenses and/or mirrors, along the path of the patterned beam of radiation between the projection grating PGR and the detection grating DGR (not shown).

In an embodiment, the detection grating DGR may be omitted, and the detector DET may be placed at the position where the detection grating DGR is located. Such a configuration provides a more direct detection of the image of the projection grating PGR.

In order to cover the surface of the substrate W effectively, a level sensor LS may be configured to project an array of measurement beams BE1 onto the surface of the substrate W, thereby generating an array of measurement areas MLO or spots covering a larger measurement range.

Various height sensors of a general type are disclosed for example in U.S. Pat. Nos. 7,265,364 and 7,646,471, both incorporated by reference. A height sensor using UV radiation instead of visible or infrared radiation is disclosed in US2010233600A1, incorporated by reference. In WO2016102127A1, incorporated by reference, a compact height sensor is described which uses a multi-element detector to detect and recognize the position of a grating image, without needing a detection grating.

Another type of metrology tool used in IC manufacture is an alignment sensor. A critical aspect of performance of the lithographic apparatus is therefore the ability to place the applied pattern correctly and accurately in relation to features laid down in previous layers (by the same apparatus or a different lithographic apparatus). For this purpose, the substrate is provided with one or more sets of marks or targets. Each mark is a structure whose position can be measured at a later time using a position sensor, typically an optical position sensor. The position sensor may be referred to as "alignment sensor" and marks may be referred to as "alignment marks".

A lithographic apparatus may include one or more (e.g. a plurality of) alignment sensors by which positions of alignment marks provided on a substrate can be measured accurately. Alignment (or position) sensors may use optical phenomena such as diffraction and interference to obtain position information from alignment marks formed on the substrate. An example of an alignment sensor used in current lithographic apparatus is based on a self-referencing interferometer as described in U.S. Pat. No. 6,961,116. Various enhancements and modifications of the position sensor have been developed, for example as disclosed in US2015261097A1. The contents of all of these publications are incorporated herein by reference.

Figure 6:
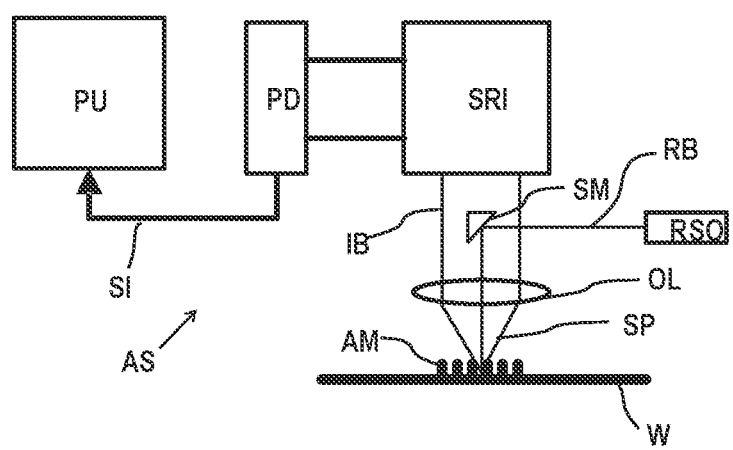
FIG. 6 depicts a schematic overview of an alignment sensor apparatus which may comprise a radiation source according to embodiments of the invention.

FIG. 6 is a schematic block diagram of an embodiment of a known alignment sensor AS, such as is described, for example, in U.S. Pat. No. 6,961,116, and which is incorporated by reference. Radiation source RSO provides a beam RB of radiation of one or more wavelengths, which is diverted by diverting optics onto a mark, such as mark AM located on substrate W, as an illumination spot SP. In this example the diverting optics comprises a spot mirror SM and an objective lens OL. The illumination spot SP, by which the mark AM is illuminated, may be slightly smaller in diameter than the width of the mark itself.

Radiation diffracted by the alignment mark AM is collimated (in this example via the objective lens OL) into an information-carrying beam IB. The term "diffracted" is intended to include zero-order diffraction from the mark (which may be referred to as reflection). A self-referencing interferometer SRI, e.g. of the type disclosed in U.S. Pat. No. 6,961,116 mentioned above, interferes the beam IB with itself after which the beam is received by a photodetector PD. Additional optics (not shown) may be included to provide separate beams in case more than one wavelength is created by the radiation source RSO. The photodetector may be a single element, or it may comprise a number of pixels, if desired. The photodetector may comprise a sensor array.

The diverting optics, which in this example comprises the spot mirror SM, may also serve to block zero order radiation reflected from the mark, so that the information-carrying beam IB comprises only higher order diffracted radiation from the mark AM (this is not essential to the measurement, but improves signal to noise ratios).

Intensity signals SI are supplied to a processing unit PU. By a combination of optical processing in the block SRI and computational processing in the unit PU, values for X- and Y-position on the substrate relative to a reference frame are output.

A single measurement of the type illustrated only fixes the position of the mark within a certain range corresponding to one pitch of the mark. Coarser measurement techniques are used in conjunction with this to identify which period of a sine wave is the one containing the marked position. The same process at coarser and/or finer levels may be repeated at different wavelengths for increased accuracy and/or for robust detection of the mark irrespective of the materials from which the mark is made, and materials on and/or below which the mark is provided. The wavelengths may be multiplexed and de-multiplexed optically so as to be processed simultaneously, and/or they may be multiplexed by time division or frequency division.

In this example, the alignment sensor and spot SP remain stationary, while it is the substrate W that moves. The alignment sensor can thus be mounted rigidly and accurately to a reference frame, while effectively scanning the mark AM in a direction opposite to the direction of movement of substrate W. The substrate W is controlled in this movement by its mounting on a substrate support and a substrate positioning system controlling the movement of the substrate support. A substrate support position sensor (e.g. an interferometer) measures the position of the substrate support (not shown). In an embodiment, one or more (alignment) marks are provided on the substrate support. A measurement of the position of the marks provided on the substrate support allows the position of the substrate support as determined by the position sensor to be calibrated (e.g. relative to a frame to which the alignment system is connected). A measurement of the position of the alignment marks provided on the substrate allows the position of the substrate relative to the substrate support to be determined.

For optical semiconductor metrology, inspection applications, such as in any of the aforementioned metrology tools, a bright radiation source which outputs coherent radiation, simultaneously covering a broad wavelength range (e.g., from UV to IR), is often preferred. Such a broadband radiation source can help improve the flexibility and robustness of applications by allowing substrates with different material characteristics to be optically examined in the same setup/system without a need for any hardware change (e.g., changing a radiation source so as to have a specific wavelength). Allowing the wavelength to be optimized for a specific application also means that the accuracy of measurements can be further increased.

Gas lasers, which are based on the gas-discharge effect to simultaneously emit multiple wavelengths, can be used in these applications. However, intrinsic issues such as high intensity instability and low spatial incoherence associated with gas lasers can make them unsuitable. Alternatively, outputs from multiple lasers (e.g., solid-state lasers) with different wavelengths can be spatially combined into the optical path of a metrology or inspection system so as to provide a multiple wavelength source. The complexity and high implementation costs, which increases with the number of wavelengths desired, prevents such a solution from being widely used. In contrast, a fiber-based broadband or white light laser, also called a supercontinuum laser, is able to emit radiation with high spatial coherence and broad spectral coverage, e.g., from UV to IR, and therefore is a very attractive and practical option.

A hollow-core photonic crystal fiber (HC-PCF) is a special type of optical fiber that comprises a central hollow core region and an inner cladding structure surrounding the hollow core, both of which extend axially along the entire fiber. The radiation guidance mechanism is enabled by the inner cladding waveguide structure, which may comprise, for example, thin-walled glass elements. The radiation is thus confined predominantly inside a hollow core and propagates along the fiber in the form of transverse core modes.

Metrology tools, such as a scatterometer, topography measurement systems, or position measurement systems mentioned above may use radiation originating from a radiation source to perform a measurement. One or more properties of the radiation used by a metrology tool may affect the type and quality of measurements that may be performed. For some applications, it may be advantageous to use multiple radiation frequencies to measure a substrate, for example broadband radiation may be used. Multiple different frequencies may be able to propagate, irradiate, and scatter off a metrology target with no or minimal interference with other frequencies. Therefore different frequencies may for example be used to obtain more metrology data simultaneously. Different radiation frequencies may also be able to interrogate and discover different properties of a metrology target. Broadband radiation may be useful in metrology systems MT such as for example level sensors, alignment mark measurement systems, scatterometry tools, or inspection tools. A broadband radiation source may be a supercontinuum source.

High quality broadband radiation, for example supercontinuum radiation, may be difficult to generate. One method for generating broadband radiation may be to broaden high-power narrow band or single frequency input radiation, for example making use of non-linear, higher order effects. The input radiation (which may be produced using a laser) may be referred to as pump laser radiation. Alternatively, the input radiation may be referred to as seed radiation. To obtain high power radiation for broadening effects, radiation may be confined into a small area so that strongly localized high intensity radiation is achieved. In those areas, the radiation may interact with broadening structures and/or materials forming a non-linear medium so as to create broadband output radiation. In the high intensity radiation areas, different materials and/or structures may be used to enable and/or improve radiation broadening by providing a suitable non-linear medium.

In some implementations, the broadband output radiation is created in a photonic crystal fiber (PCF). In several embodiments, such a photonic crystal fiber has microstructures around its fiber core assisting in confining radiation that travels through the fiber in the fiber core. The fiber core can be made of a solid material that has one or more non-linear properties and that is capable of generating broadband radiation when high intensity pump laser radiation is transmitted through the fiber core. Although it is feasible to generate broadband radiation in solid core photonic crystal fibers, there may be a few disadvantages of using a solid material. For example, if UV radiation is generated in the solid core, this radiation might not be present in the output spectrum of the fiber because the radiation is absorbed by most solid material.

In some implementations, as discussed further below with reference to FIG. 7B, methods and apparatus for broadening input radiation may use a fiber for confining input radiation, and for broadening the input radiation to output broadband radiation. The fiber may be a hollow core fiber, and may comprise internal structures to achieve effective guiding and confinement of radiation in the fiber. The fiber may be a hollow core photonic crystal fiber (HC-PCF), which is particularly suitable for strong radiation confinement, predominantly inside the hollow core of the fiber, achieving high radiation intensities. The hollow core of the fiber may be filled with a working medium acting as a broadening medium for broadening input radiation. Such a fiber and working medium arrangement may be used to create a supercontinuum radiation source. Radiation input to the fiber may be electromagnetic radiation, for example radiation in one or more of the infrared, visible, UV, and/or extreme UV spectra. The output radiation may consist of or comprise broadband radiation, which may include white light.

Some embodiments relate to a new design of such a broadband radiation source comprising an optical fiber. The optical fiber is a hollow-core, photonic crystal fiber (HC-PCF). In particular, the optical fiber may be a hollow-core, photonic crystal fiber of a type comprising anti-resonant structures for confinement of radiation. Such fibers comprising anti-resonant structures are known as anti-resonant fibers, tubular fibers, single-ring fibers, negative curvature fibers or inhibited coupling fibers. Various different designs of such fibers are known. The optical fiber may be hollow core, photonic bandgap fibers (HC-PBFs, for example a Kagome fiber).

A number of types of HC-PCFs can be engineered, each based on a different physical guidance mechanism. Two such HC-PCFs include: hollow-core photonic bandgap fibers (HC-PBFs) and hollow-core anti-resonant reflecting fibers (HC-ARFs). Detail on the design and manufacture of HC-PCFs can be found in U.S. patent application publication no. US2004/015085 (for HC-PBFs) and PCT patent application publication no. WO2017/032454 (for HC-ARFs), each of which is incorporated herein in its entirety by reference. FIG. 7C shows an example of a Kagome fiber, comprising a Kagome lattice structure.

An example of an optical fiber for use in the radiation source is now described with reference to FIG. 7A, which is a schematic cross sectional view of the optical fiber OF in a transverse plane, and FIG. 7B. Further embodiments similar to the practical example of the fiber of FIG. 7A are disclosed in PCT patent application publication no. WO2017/032454.

The optical fiber OF comprises an elongate body, which is longer in one dimension compared to the other two dimensions of the fiber OF. This longer dimension may be referred to as an axial direction and may define an axis of the optical fiber OF. The two other dimensions define a plane which may be referred to as a transverse plane. FIG. 7A shows a cross-section of the optical fiber OF in this transverse plane (i.e. perpendicular to the axis), which is labelled as the x-y plane. The transverse cross-section of the optical fiber OF may be substantially constant along the fiber axis.

It will be appreciated that the optical fiber OF has some degree of flexibility and therefore the direction of the axis will not, in general, be uniform along the length of the optical fiber OF. The terms such as the optical axis, the transverse cross-section and the like will be understood to mean the local optical axis, the local transverse cross-section and so on. Furthermore, where components are described as being cylindrical or tubular these terms will be understood to encompass such shapes that may have been distorted as the optical fiber OF is flexed.

The optical fiber OF may have any length and it will be appreciated that the length of the optical fiber OF may be dependent on the application. The optical fiber OF may have a length between 1 cm and 10 m, for example, the optical fiber OF may have a length between 10 cm and 100 cm.

The optical fiber OF comprises: a hollow core HC; a cladding portion surrounding the hollow core HC; and a support portion SP surrounding and supporting the cladding portion. The optical fiber OF may be considered to comprise a body (comprising the cladding portion and the support portion SP) having a hollow core HC. The cladding portion comprises a plurality of anti-resonance elements for guiding radiation through the hollow core HC. In particular, the plurality of anti-resonance elements are arranged to confine radiation that propagates through the optical fiber OF predominantly inside the hollow core HC and to guide the radiation along the optical fiber OF. The hollow core HC of the optical fiber OF may be disposed substantially in a central region of the optical fiber OF, so that the axis of the optical fiber OF may also define an axis of the hollow core HC of the optical fiber OF.

The cladding portion comprises a plurality of anti-resonance elements for guiding radiation propagating through the optical fiber OF. In particular, in this embodiment, the cladding portion comprises a ring of tubular capillaries CAP (e.g., a single ring of six of tubular capillaries CAP). Each of the capillaries CAP acts as an anti-resonance element.

The capillaries CAP may also be referred to as tubes. The capillaries CAP may be circular in cross section, or may have another shape. Each capillary CAP comprises a generally cylindrical wall portion WP that at least partially defines the hollow core HC of the optical fiber OF and separates the hollow core HC from a capillary cavity CC. It will be appreciated that the wall portion WP may act as an anti-reflecting Fabry-Perot resonator for radiation that propagates through the hollow core HC (and which may be incident on the wall portion WP at a grazing incidence angle). The thickness of the wall portion WP may be suitable so as to ensure that reflection back into the hollow core HC is generally enhanced whereas transmission into the capillary cavity CC is generally suppressed. In some embodiments, the capillary wall portion WP may have a thickness between 0.01-10.0 μm.

It will be appreciated that, as used herein, the term cladding portion is intended to mean a portion of the optical fiber OF for guiding radiation propagating through the optical fiber OF (i.e. the capillaries CAP which confine the radiation within the hollow core HC). The radiation may be confined in the form of transverse modes, propagating along the fiber axis.

The support portion is generally tubular and supports the capillaries CAP of the cladding portion. The capillaries CAP are distributed evenly around an inner surface if the inner support portion SP. In the embodiment of FIG. 7B, the capillaries CAP may be described as being disposed in a generally hexagonal formation.

The capillaries CAP are arranged so that each capillary is not in contact with any of the other capillaries CAP. Each of the capillaries CAP is in contact with the inner support portion SP and spaced apart from adjacent capillaries CAP in the ring structure. Such an arrangement may be beneficial since it may increase a transmission bandwidth of the optical fiber OF (relative, for example, to an arrangement wherein the capillaries are in contact with each other). Alternatively, in some embodiments, each of the capillaries CAP may be in contact with adjacent capillaries CAP in the ring structure.

The capillaries CAP of the cladding portion are disposed in a ring structure around the hollow core HC. An inner surface of the ring structure of capillaries CAP at least partially defines the hollow core HC of the optical fiber OF. The cross-sectional dimension (e.g., diameter) d of the hollow core HC (which may be defined as the smallest dimension between opposed capillaries, indicated by arrow d) may be between 10 and 1000 μm. The cross-sectional dimension d of the hollow core HC may affect the mode field diameter, impact loss, dispersion, modal plurality, and/or one or more non-linearity properties of the hollow core optical fiber OF.

In this embodiment, the cladding portion comprises a single ring arrangement of capillaries CAP (which act as anti-resonance elements). Therefore, a line in any radial direction from a central portion of the hollow core HC to an exterior of the optical fiber OF passes through no more than one capillary CAP.

It will be appreciated that other embodiments may be provided with different arrangements of anti-resonance elements. These may include arrangements having multiple rings of anti-resonance elements and arrangements having nested anti-resonance elements. Furthermore, although the embodiment shown in FIG. 7A comprises a ring of six capillaries, in other embodiments, one or more rings comprising any number of anti-resonance elements (for example 4, 5, 6, 7, 8, 9, 10, 11 or 12 capillaries) may be provided in the cladding portion.

FIG. 7D shows a modified embodiment of the above discussed HC-PCFs with a ring of tubular capillaries. In the example of FIG. 7D there are two coaxial rings of tubular capillaries. For holding the inner and outer rings of tubular capillaries, a support tube ST may be included in the HC-PCF. The support tube may be made of silica.

The tubular capillaries of the examples of FIGS. 7A, 7C and 7D may have a circular cross-sectional shape. Other shapes are also possible for the tubular capillaries, like elliptical or polygonal cross-sections. Additionally, the solid material of the tubular capillaries of the examples of FIGS. 7A, 7C and 7D may comprise plastic material (like PMA), glass (like silica), or soft glass.

FIG. 7B depicts a radiation source RDS configured to provide broadband output radiation. The radiation source RDS comprises a pulsed pump radiation source PRS or any other type of source that is capable of generating short pulses of a desired length and energy level; an optical fiber OF (for example of the type shown in FIG. 7A) with a hollow core HC; and a working medium WM (for example a gas) disposed within the hollow core HC. Although in FIG. 7B the radiation source RDS comprises the optical fiber OF shown in FIG. 7A, in alternative embodiments other types of hollow core optical fiber may be used.

The pulsed pump radiation source PRS is configured to provide input radiation IRD. The hollow core HC of the optical fiber OF is arranged to receive the input radiation IRD from the pulsed pump radiation source PRS, and broaden it to provide output radiation ORD. The working medium WM enables the broadening of the frequency range of the received input radiation IRD so as to provide broadband output radiation ORD.

The radiation source RDS further comprises a reservoir RSV. The optical fiber OF is disposed inside the reservoir RSV. The reservoir RSV may also be referred to as a housing, container or gas cell. The reservoir RSV is configured to contain the working medium WM. The reservoir RSV may comprise one or more features, known in the art, configured to control, regulate, and/or monitor the composition of the working medium WM (which may be a gas) inside the reservoir RSV. The reservoir RSV may comprise a first transparent window TW1. In use, the optical fiber OF is disposed inside the reservoir RSV such that the first transparent window TW1 is located proximate to an input end IE of the optical fiber OF. The first transparent window TW1 may form part of a wall of the reservoir RSV. The first transparent window TW1 may be transparent for at least the received one or more input radiation frequencies, so that received input radiation IRD (or at least a large portion thereof) may be coupled into the optical fiber OF located inside reservoir RSV. It will be appreciated that optics (not shown) may be provided for coupling the input radiation IRD into the optical fiber OF.

The reservoir RSV comprises a second transparent window TW2, forming part of a wall of the reservoir RSV. In use, when the optical fiber OF is disposed inside the reservoir RSV, the second transparent window TW2 is located proximate to an output end OE of the optical fiber OF. The second transparent window TW2 may be transparent for at least the frequencies of the broadband output radiation ORD of the apparatus.

Alternatively, in another embodiment, the two opposed ends of the optical fiber OF may be placed inside different reservoirs. The optical fiber OF may comprise a first end section configured to receive input radiation IRD, and a second end section for outputting broadband output radiation ORD. The first end section may be placed inside a first reservoir, comprising a working medium WM. The second end section may be placed inside a second reservoir, wherein the second reservoir may also comprise a working medium WM. The functioning of the reservoirs may be as described in relation to FIG. 7B above. The first reservoir may comprise a first transparent window, configured to be transparent for input radiation IRD. The second reservoir may comprise a second transparent window configured to be transparent for broadband output broadband radiation ORD. The first and second reservoirs may also comprise a sealable opening to permit the optical fiber OF to be placed partially inside and partially outside the reservoir, so that a gas can be sealed inside the reservoir. The optical fiber OF may further comprise a middle section not contained inside a reservoir. Such an arrangement using two separate gas reservoirs may be particularly convenient for embodiments wherein the optical fiber OF is relatively long (for example when the length is more than 1 m). It will be appreciated that for such arrangements which use two separate gas reservoirs, the two reservoirs (which may comprise one or more features, known in the art, for controlling, regulating, and/or monitoring the composition of a gas inside the two reservoirs) may be considered to provide an apparatus for providing the working medium WM within the hollow core HC of the optical fiber OF.

In this context a window may be transparent for a frequency if at least 50%, 75%, 85%, 90%, 95%, or 99% of incident radiation of that frequency on the window is transmitted through the window.

Both the first TW1 and the second TW2 transparent windows may form a gas tight seal within the walls of the reservoir RSV so that the working medium WM (which may be a gas) may be contained within the reservoir RSV. It will be appreciated that the working medium WM may be contained within the reservoir RSV at a pressure different to the ambient pressure of the reservoir RSV.

The working medium WM may comprise a noble gas such as argon, krypton, and/or xenon, a Raman active gas such as hydrogen, deuterium and/or nitrogen, or a gas mixture such as an argon/hydrogen mixture, a xenon/deuterium mixture, a krypton/nitrogen mixture, or a nitrogen/hydrogen mixture. Depending on the type of filling gas, the nonlinear optical processes can include modulational instability (MI), soliton self-compression, soliton fission, Kerr effect, Raman effect and/or dispersive wave generation, details of which are described in PCT patent application publication no. WO2018/127266 and U.S. Pat. No. 9,160,137, both of which are hereby incorporated in their entireties by reference. Since the dispersion of the filling gas can be tuned by varying the working medium WM pressure in the reservoir RSV (i.e. gas cell pressure), the generated broadband pulse dynamics and the associated spectral broadening characteristics can be adjusted so as to optimize frequency conversion.

In one implementation, the working medium WM may be disposed within the hollow core HC at least during receipt of input radiation IRD for producing broadband output radiation ORD. It will be appreciated that, while the optical fiber OF is not receiving input radiation IRD for producing broadband output radiation, the gas WM may be wholly or partially absent from the hollow core HC.

In order to achieve frequency broadening, high intensity radiation may be desirable. An advantage of having a hollow core optical fiber OF is that it may achieve high intensity radiation through strong spatial confinement of radiation propagating through the optical fiber OF, achieving high localized radiation intensities. The radiation intensity inside the optical fiber OF may be high, for example due to high received input radiation intensity and/or due to strong spatial confinement of the radiation inside the optical fiber OF. An advantage of hollow core optical fibers is that they can guide radiation having a broader wavelength range than solid-core fibers and, in particular, hollow core optical fibers can guide radiation in both the ultraviolet and infrared ranges.

An advantage of using a hollow core optical fiber OF may be that the majority of the radiation guided inside the optical fiber OF is confined to the hollow core HC. Therefore, the majority of the interaction of the radiation inside the optical fiber OF is with the working medium WM, which is provided inside the hollow core HC of the optical fiber OF. As a result, the broadening effects of the working medium WM on the radiation may be increased.

The received input radiation IRD may be electromagnetic radiation. The input radiation IRD may be received as pulsed radiation. For example, the input radiation IRD may comprise ultrafast pulses, for example, generated by a laser.

The input radiation IRD may be coherent radiation. The input radiation IRD may be collimated radiation, an advantage of which may be to facilitate and improve the efficiency of coupling the input radiation IRD into the optical fiber OF. The input radiation IRD may comprise a single frequency, or a narrow range of frequencies. The input radiation IRD may be generated by a laser. Similarly, the output radiation ORD may be collimated and/or may be coherent.

The broadband range of the output radiation ORD may be a continuous range, comprising a continuous range of radiation frequencies. The output radiation ORD may comprise supercontinuum radiation. Continuous radiation may be beneficial for use in a number of applications, for example in metrology applications. For example, the continuous range of frequencies may be used to interrogate a large number of properties. The continuous range of frequencies may for example be used to determine and/or eliminate a frequency dependency of a measured property. Supercontinuum output radiation ORD may comprise for example electromagnetic radiation over a wavelength range of 100 nm-4000 nm or over a subset of 400 nm or more of that range. The broadband output radiation ORD frequency range may be for example 400 nm-900 nm, 500 nm-900 nm, or 200 nm-2000 nm. The supercontinuum output radiation ORD may comprise white light.

The input radiation IRD provided by the pulsed pump radiation source PRS may be pulsed. The input radiation IRD may comprise electromagnetic radiation of one or more frequencies between 200 nm and 2 μm. The input radiation IRD may for example comprise electromagnetic radiation with a wavelength of 1.03 μm. The repetition rate of the pulsed radiation IRD may be of an order of magnitude of 1 kHz to 100 MHz. The pulse energies may have an order of magnitude of 0.1 μJ to 100 μJ, for example 1-10 μJ. A pulse duration for the input radiation IRD may be between 10 fs and 10 ps, for example 300 fs. The average power of input radiation IRD may be between 100 mW to several 100 W. The average power of input radiation IRD may for example be 20-50 W.

The pulsed pump radiation source PRS may be a laser. The spatio-temporal transmission characteristics of such a laser pulse, e.g. its spectral amplitude and phase, transmitted along the optical fiber OF can be varied and tuned through adjustment of one or more (pump) laser parameters, one or more working component WM variations, and/or one or more optical fiber OF parameters. The one or more spatio-temporal transmission characteristics may include one or more selected from: output power, output mode profile, output temporal profile, width of the output temporal profile (or output pulse width), output spectral profile, and/or bandwidth of the output spectral profile (or output spectral bandwidth). The one or more pulse pump radiation source PRS parameters may include one or more selected from: pump wavelength, pump pulse energy, pump pulse width, and/or pump pulse repetition rate. The one or more optical fiber OF parameters may include one or more selected from: optical fiber length, size and/or shape of the hollow core, size and/or shape of the capillaries, and/or thickness of the walls of the capillaries surrounding the hollow core. The one or more working component WM, e.g. filling gas, parameters may include one or more of: gas type, gas pressure and gas temperature.

The broadband output radiation ORD provided by the radiation source RDS may have an average output power of at least 1 W. The average output power may be at least 5 W. The average output power may be at least 10 W. The broadband output radiation ORD may be pulsed broadband output radiation ORD. The broadband output radiation ORD may have a power spectral density in the entire wavelength band of the output radiation of at least 0.01 mW/nm. The power spectral density in the entire wavelength band of the broadband output radiation may be at least 3 mW/nm.

FIG. 8 illustrates a broadband radiation source (e.g., white light) arrangement. FIG. 8A is a schematic illustration of the main components of such a source. A laser unit LU generates an input beam $B_{in}$ which enters gas cell GC and fiber HC-PCF. The output beam $B_{out}$ from the fiber HC-PCF, comprising spectrally broadened pulses, is used by an apparatus unit AU (e.g., any of the devices describe in relation to FIGS. 4 to 6) to generate an illumination beam $B_{ill}$ to illuminate a substrate W. For example, the illumination beam $B_{ill}$ may illuminate a target (e.g., an optical grating) on the substrate. The target may be stationary or may move under the illumination beam. Once the data from the measurement has been acquired, the substrate may be positioned to illuminate a new target or may be removed for further processing steps. A control and processing unit CPU sends control signals CS and receives data signals DS (e.g., comprising measurement data) from the apparatus unit AU. The spectrally broadened pulses may be custom-tailored in the apparatus unit AU for downstream use.

In current white light sources, the pump laser radiation pulses LP are delivered at a specific repetition rate ($f_{rep}$) in the form of a conventional pulse train (e.g., a train of radiation pulses) with an equally spaced temporal delay ($1/f_{rep}$) between each individual pulse. FIG. 8B illustrates this; it comprises a plot of intensity I against time t for the input beam $B_{in}$.

The lifetime of the current white light source can be quantified by monitoring the average output power over time. Typical operation hours before a pronounced power decay, it is observed, are on the order of a few 100 hours for a pulse train with a repetition rate of some MHz. This limited lifetime has a strong impact for high-volume manufacturing of semiconductor devices because frequent replacements of critical components are necessary. It has been identified that a critical component is the HC-PCF assembly in the gas cell GC. Consequently it would be highly desirable to improve the HC-PCF lifetime.

Another issue is the upper limit of usable repetition rates. This is likely caused by thermal effects (from the average power of the pulse train) and/or by ionization effects (by the high peak powers of each individual pulse); by increasing the repetition rate beyond this upper limit, pronounced instabilities of the optical performance emerge. Because power spectral density (PSD) scaling and pulse-to-pulse noise reduction both scale with repetition rate, it would be desirable to operate at an effective higher repetition rate. The PSD is typically linearly scaling with repetition rate and the pulse-to-pulse noise is reduced with the square root of repetition rate scaling.

To address this, it is proposed that the succession of pump pulses of the pump laser radiation is changed from a train of pulses (as illustrated by FIG. 8B) to a burst mode such as illustrated by FIG. 9B. In the burst mode, each burst (with burst duration $T_{burst}$) comprises of a number of pump pulses. The individual bursts have a temporal delay $T_{delay}$, which may be much longer (e.g., more than 2 times, more than 5 times, more than 10 times or more than 100 times longer) than the temporal delay between each individual pump pulse. The number of pump pulses per burst and the temporal delay between bursts can be adapted if necessary.

A main advantage of such an arrangement is that the burst can be synchronized with the time when a measurement at the substrate is performed. This enables radiation-on-demand operation and can greatly reduce the exposure of the HC-PCF to high-intensity pump pulses. The total lifetime of the HC-PCF in the radiation source can be linked to the total exposure level and hence, a reduction of the exposure rate would directly result in an increased absolute fiber lifetime.

For example, in an alignment sensor, each measurement target on the substrate may be illuminated for 4 ms. There are 50 targets on one substrate, and the substrate is scanned in 30 s. Assuming perfect radiation-on-demand (i.e., synchronization effectiveness 100%) is achieved, an exposure reduction of the HC-PCF of 150× is achieved compared to the conventional pulse train. Should the lifetime of a HC-PCF indeed scale with exposure, a lifetime of several 10,000 hours may be feasible. It may be noted that in radiation-on-demand operation, the effective PSD on the target is not changed compared to conventional pulse train operation. Also of note is that the total average output power is reduced by the same factor as the exposure (i.e. 150× for this example). In this case, a 15 W output power would be reduced to 100 mW.

Because of the reduced average power, the repetition rate of the pump laser may be increased beyond the upper limit for a pulse train, which has a positive effect on PSD scaling and pulse-to-pulse noise reduction.

In addition, the lower average power results in an average reduction in the heat load along the optical path after the modulator (see below), including the HC-PCF within the gas cell, the application unit, and all optical elements. The heat load may be caused e.g., by partial absorption of the pump pulses or the spectrally broadened pulses by the optical elements or by the HC-PCF. Consequently, a smaller dimensioned cooling system can be used for maintaining the system within a required temperature range.

Furthermore, the reduced heat load reduces potential misalignment of optics due to thermal expansion, and hence improves the overall system stability.

In an embodiment, the system may be arranged to have no bursts at times where no substrate is being measured (i.e., to switch-off the radiation source). However this may have undesirable effects on stability of the source. Therefore other arrangements will be described.

FIG. 9A shows a measurement arrangement according to an embodiment. The setup is similar to that of FIG. 8A. A main difference is that a modulator MOD is provided which modulates the input beam to generate modulated pump laser radiation; i.e., a modulated input beam $B_{mod}$. The modulator may be controlled via a trigger signal TS or modulator control signal which may be generated by processor or control and processing unit CPU.

The modulator may be an opto-mechanical and/or electro-optical component that can (partially or fully) reflect/block/attenuate/scatter or transmit the pulses from the pulse train. Specific examples include acoustic-optical filters, flip/galvo mirrors, motorized shutters or rotating blades. The appropriate choice may depend on the required modulation frequency.

To enable burst mode operation, the metrology device may provide a trigger signal TS such as illustrated in FIG. 9C. For example, the metrology device's control and processing unit CPU can generate the trigger signal TS as a feedback signal to control the modulator MOD. For example, the control and processing unit CPU may be operable to synchronize generation of a burst of pulses with the performance of a measurement by the metrology device (i.e., so as to generate bursts when a measurement is being performed).

The burst mode operation may also be active (e.g., with an average delay period $T_{delay}$ and burst period $T_{burst}$) while no scan is active (e.g., during a substrate exchange). This avoids changes in the thermal load on all relevant components along the optical path from the modulator to the application unit.

In general, the time $T_{delay}$ between the illumination of two consecutive targets (time between two trigger signals) will not be constant and therefore slight variations in the average output power can be expected. This may have negative impact on e.g., the temperature stability of the whole system, resulting in potential drifts of optical components. To compensate for this, intermediate pulses with variable duration and timing and/or a variable burst length may be introduced. The parameters of these additional pulses will depend on the actual scan pattern on the substrate and substrate exchange times. As such, these parameters which control the intermediate pulses and/or burst length may be optimized to achieve a high uniformity of the output power. It is desirable that the averaged output power within a period of <60 s, or <30 s, or <10 s, or <1 s, or <300 ms, or <100 ms has a high uniformity; e.g., it varies by not more than 10%, or not more than 1%, or not more than 0.1%.

Figure 10:
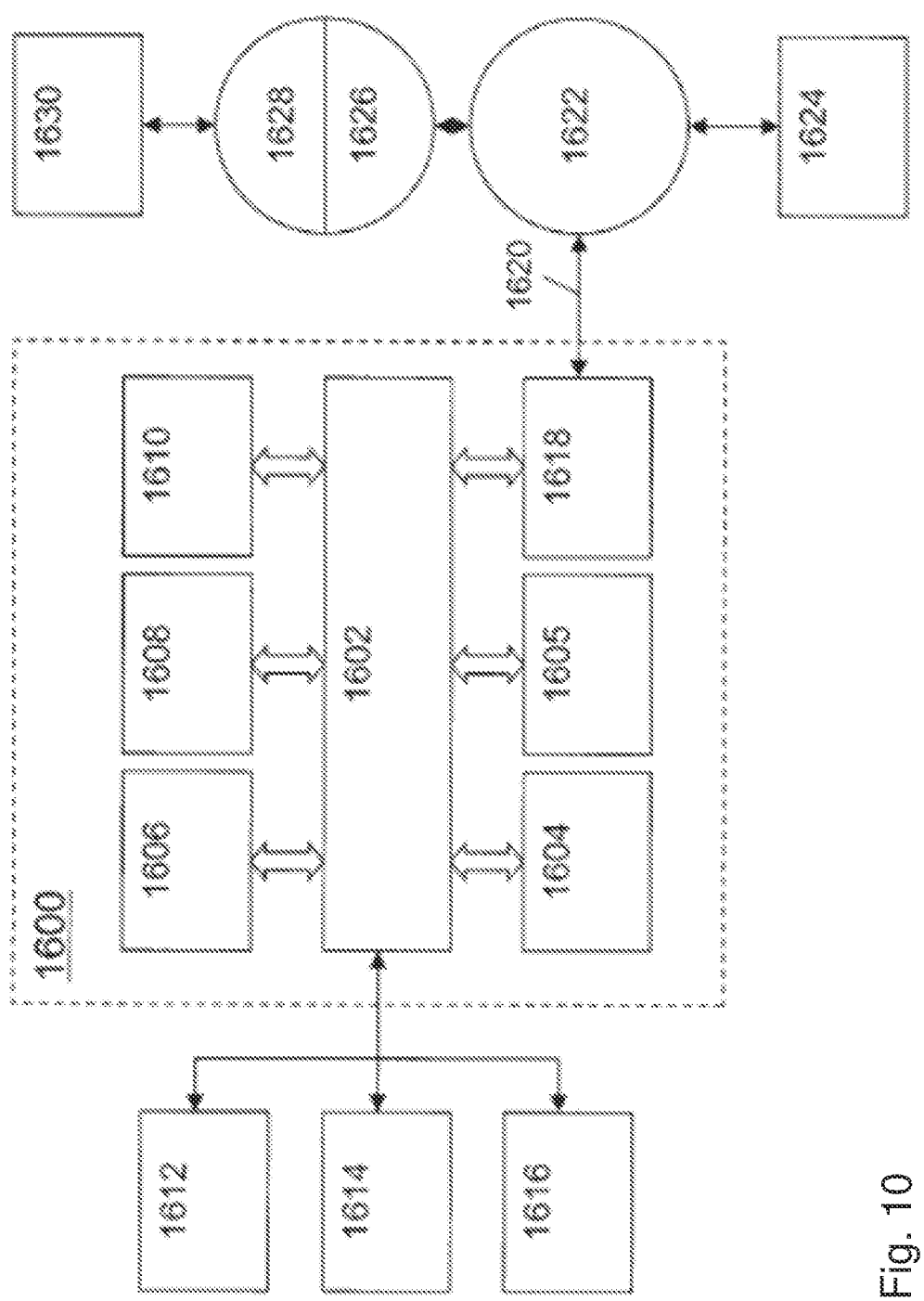
FIG. 10 is a block diagram of a computer system which may assist in implementing the methods and flows according to embodiments of the invention.

FIG. 10 is a block diagram that illustrates a computer system 1600 that may assist in implementing the methods and flows disclosed herein. Computer system 1600 includes a bus 1602 or other communication mechanism for communicating information, and a processor 1604 (or multiple processors 1604 and 1605) coupled with bus 1602 for processing information. Computer system 1600 also includes a main memory 1606, such as a random access memory (RAM) or other dynamic storage device, coupled to bus 1602 for storing information and instructions to be executed by processor 1604. Main memory 1606 also may be used for storing temporary variables or other intermediate information during execution of instructions to be executed by processor 1604. Computer system 1600 further includes a read only memory (ROM) 1608 or other static storage device coupled to bus 1602 for storing static information and instructions for processor 1604. A storage device 1610, such as a magnetic disk or optical disk, is provided and coupled to bus 1602 for storing information and instructions.

Computer system 1600 may be coupled via bus 1602 to a display 1612, such as a cathode ray tube (CRT) or flat panel or touch panel display for displaying information to a computer user. An input device 1614, including alphanumeric and other keys, is coupled to bus 1602 for communicating information and command selections to processor 1604. Another type of user input device is cursor control 1616, such as a mouse, a trackball, or cursor direction keys for communicating direction information and command selections to processor 1604 and for controlling cursor movement on display 1612. This input device typically has two degrees of freedom in two axes, a first axis (e.g., x) and a second axis (e.g., y), that allows the device to specify positions in a plane. A touch panel (screen) display may also be used as an input device.

One or more of the methods as described herein may be performed by computer system 1600 in response to processor 1604 executing one or more sequences of one or more instructions contained in main memory 1606. Such instructions may be read into main memory 1606 from another computer-readable medium, such as storage device 1610. Execution of the sequences of instructions contained in main memory 1606 causes processor 1604 to perform the process steps described herein. One or more processors in a multi-processing arrangement may also be employed to execute the sequences of instructions contained in main memory 1606. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 1604 for execution. Such a medium may take many forms, including but not limited to, non-volatile media, volatile media, and transmission media. Non-volatile media include, for example, optical or magnetic disks, such as storage device 1610. Volatile media include dynamic memory, such as main memory 1606. Transmission media include coaxial cables, copper wire and fiber optics, including the wires that comprise bus 1602. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 1604 for execution. For example, the instructions may initially be borne on a magnetic disk of a remote computer. The remote computer can load the instructions into its dynamic memory and send the instructions over a telephone line using a modem. A modem local to computer system 1600 can receive the data on the telephone line and use an infrared transmitter to convert the data to an infrared signal. An infrared detector coupled to bus 1602 can receive the data carried in the infrared signal and place the data on bus 1602. Bus 1602 carries the data to main memory 1606, from which processor 1604 retrieves and executes the instructions. The instructions received by main memory 1606 may optionally be stored on storage device 1610 either before or after execution by processor 1604.

Computer system 1600 also preferably includes a communication interface 1618 coupled to bus 1602. Communication interface 1618 provides a two-way data communication coupling to a network link 1620 that is connected to a local network 1622. For example, communication interface 1618 may be an integrated services digital network (ISDN) card or a modem to provide a data communication connection to a corresponding type of telephone line. As another example, communication interface 1618 may be a local area network (LAN) card to provide a data communication connection to a compatible LAN. Wireless links may also be implemented. In any such implementation, communication interface 1618 sends and receives electrical, electromagnetic or optical signals that carry digital data streams representing various types of information.

Network link 1620 typically provides data communication through one or more networks to other data devices. For example, network link 1620 may provide a connection through local network 1622 to a host computer 1624 or to data equipment operated by an Internet Service Provider (ISP) 1626. ISP 1626 in turn provides data communication services through the worldwide packet data communication network, now commonly referred to as the "Internet" 1628. Local network 1622 and Internet 1628 both use electrical, electromagnetic or optical signals that carry digital data streams. The signals through the various networks and the signals on network link 1620 and through communication interface 1618, which carry the digital data to and from computer system 1600, are exemplary forms of carrier waves transporting the information.

Computer system 1600 may send messages and receive data, including program code, through the network(s), network link 1620, and communication interface 1618. In the Internet example, a server 1630 might transmit a requested code for an application program through Internet 1628, ISP 1626, local network 1622 and communication interface 1618. One such downloaded application may provide for one or more of the techniques described herein, for example. The received code may be executed by processor 1604 as it is received, and/or stored in storage device 1610, or other non-volatile storage for later execution. In this manner, computer system 1600 may obtain application code in the form of a carrier wave.

Further embodiments are disclosed in the subsequent numbered list of clauses:

1. A supercontinuum radiation source comprising:
    a modulator being operable to modulate pump laser radiation comprising a train of radiation pulses to provide modulated pump laser radiation, the modulation being such to selectively provide a burst of the pulses; and
    a hollow-core photonic crystal fiber being operable to receive the modulated pump laser radiation and excite a working medium contained within the hollow-core photonic crystal fiber so as to generate supercontinuum radiation.
2. A supercontinuum radiation source as defined in clause 1, wherein a period between successive individual pulses of the train of radiation pulses prior to modulation is the same as a period between successive individual pulses of the burst of pulses of the modulated pump laser radiation.
3. A supercontinuum radiation source as defined in clause 1 or clause 2, wherein the modulation is such that a temporal delay between successive instances of the bursts is over 2 times greater than a temporal delay between successive individual pump pulses.
4. A supercontinuum radiation source as defined in clause 3, being operable such that the number of pump pulses per burst and the temporal delay between bursts is controllable.
5. A supercontinuum radiation source as defined in any preceding clause, wherein the modulator comprises an opto-mechanical and/or electro-optical modulator.
6. A supercontinuum radiation source as defined in any preceding clause, wherein the modulator comprises one or more of: one or more acoustic-optical filters, one or more flip/galvo mirrors, one or more motorized shutters or one or more rotating blades.
7. A supercontinuum radiation source as defined in any preceding clause, wherein the modulator is operable to provide one or more intermediate pulses between successive bursts and/or variable burst length of each burst.
8. A supercontinuum radiation source as defined in clause 7, wherein one or more parameters of the one or more intermediate pulses and/or variable burst length is optimized for high uniformity of the average output power of the supercontinuum radiation source over a time period of less than 60 seconds.
9. A supercontinuum radiation source as defined in clause 7, wherein one or more parameters of the one or more intermediate pulses and/or variable burst length is optimized for high uniformity of the average output power of the supercontinuum radiation source over a time period of less than 1 second.
10. A supercontinuum radiation source as defined in any preceding clause, further comprising a pump laser for outputting the train of pump pulses.
11. A supercontinuum radiation source as defined in any preceding clause, wherein the supercontinuum radiation comprises a wavelength range of 200 nm to 2000 nm, or a sub-range within this range.
12. A supercontinuum radiation source as defined in any preceding clause, wherein the modulator is operable to receive a control signal, and modulate the pump laser radiation in dependence of the control signal.
13. A metrology device comprising:
    a substrate support for supporting a substrate;
    the supercontinuum radiation source of clause 12;
    an optical system operable to direct the supercontinuum radiation from the supercontinuum radiation source to the substrate; and
    a processor operable to generate the control signal.
14. A metrology device as defined in clause 13, wherein the processor is operable to synchronize generation of a burst of pulses with performance of a measurement by the metrology device.
15. A metrology device as defined in clause 13 or clause 14, wherein the metrology device is operable as scatterometer metrology apparatus.
16. A metrology device as defined in clause 13 or clause 14, wherein the metrology device is operable as a level sensor or an alignment sensor.
17. A lithographic apparatus comprising at least one the metrology device as defined in any of clauses 13, 14 or 16 for performing alignment and/or levelling metrology.
18. A lithographic cell comprising the lithographic apparatus of clause 17 and a metrology device as defined in clause 15.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A radiation source comprising:
   a modulator configured to modulate pump laser radiation comprising radiation pulses to provide modulated pump laser radiation, the modulation being such to provide a first plurality of pulses and second plurality of pulses wherein a temporal delay between the first and second plurality of pulses is longer than a temporal delay between successive individual pulses within the first or second plurality of pulses; and
   a hollow-core photonic crystal fiber configured to receive the modulated pump laser radiation having the first and second plurality of pulses and excite a working medium contained within the hollow-core photonic crystal fiber so as to generate broadband radiation.

2. The radiation source as claimed in claim 1, wherein a period between successive individual pulses of the radiation pulses prior to modulation is the same as a period between successive individual pulses of the first or second plurality of pulses of the modulated pump laser radiation.

3. The radiation source as claimed in claim 1, wherein the modulation is such that the temporal delay between the first and second plurality of pulses is over 2 times greater than a temporal delay between successive individual pump pulses within the first or second plurality of pulses.

4. The radiation source as claimed in claim 3, configured so that the number of pump pulses per the first and second plurality of pulses and the temporal delay between the first and second plurality of pulses is controllable.

5. The radiation source as claimed in claim 1, wherein the modulator is configured to provide one or more intermediate pulses between the first and second plurality of pulses and/or provide a variable length of each the first or second plurality of pulses.

6. The radiation source as claimed in claim 5, wherein one or more parameters of the one or more intermediate pulses and/or variable length is optimized for high uniformity of average output power of the radiation source over a time period of less than 60 seconds.

7. The radiation source as claimed in claim 5, wherein one or more parameters of the one or more intermediate pulses and/or variable length is optimized for high uniformity of average output power of the radiation source over a time period of less than 1 second.

8. The radiation source as claimed in claim 1, wherein the broadband radiation comprises a wavelength range of 200 nm to 2000 nm, or a sub-range of at least 400 nm within this range.

9. A metrology device comprising:
   the radiation source of claim 1;
   a substrate support configured to support a substrate;
   an optical system configured to direct the broadband radiation from the radiation source to the substrate; and
   a detector configured to detect broadband radiation redirected by the substrate.

10. The metrology device as claimed in claim 9, further comprising a processor configured to synchronize generation of the first and second plurality of pulses with performance of a measurement by the metrology device.

11. The metrology device as claimed in claim 9, wherein the metrology device is operable as a scatterometer metrology apparatus.

12. The metrology device as claimed in claim 9, wherein the metrology device is operable as a level sensor or an alignment sensor.

13. A radiation source comprising:
   a modulator configured to modulate pulsed pump laser radiation having a repetition rate to provide modulated pump laser radiation, the modulator configured to introduce a temporal delay between pulses in the pulsed pump laser radiation different than a temporal delay of the repetition rate between successive pulses of the pump laser radiation; and
   a hollow-core photonic crystal fiber configured to receive the modulated pump laser radiation and excite a working medium contained within the hollow-core photonic crystal fiber so as to generate broadband radiation.

14. The radiation source as claimed in claim 13, wherein the broadband radiation comprises a wavelength range of at least 400 nm within the range of 200 nm to 2000 nm.

15. A metrology device comprising:
   the radiation source of claim 13;
   a substrate support configured to support a substrate;
   an optical system configured to direct the broadband radiation from the radiation source to the substrate; and
   a detector configured to detect broadband radiation redirected by the substrate.

16. The metrology device as claimed in claim 15, wherein the metrology device is operable as a level sensor or an alignment sensor.

17. A radiation source comprising:
   a modulator configured to modulate pulsed pump laser radiation having a repetition rate to provide modulated pump laser radiation;
   a hollow-core photonic crystal fiber configured to receive the modulated pump laser radiation and excite a working medium contained within the hollow-core photonic crystal fiber so as to generate broadband radiation; and
   a processor configured to cause the modulator to introduce a temporal delay between pulses in the pulsed pump laser radiation different than a temporal delay of the repetition rate between successive pulses of the pump laser radiation in synchronization with performance of a measurement by a metrology device using the broadband radiation.

18. The radiation source as claimed in claim 17, wherein the broadband radiation comprises a wavelength range of at least 400 nm within the range of 200 nm to 2000 nm.

19. A metrology device comprising:
the radiation source of claim 17;
a substrate support configured to support a substrate;
an optical system configured to direct the broadband radiation from the radiation source to the substrate; and
a detector configured to detect broadband radiation redirected by the substrate.

20. The metrology device as claimed in claim 19, wherein the metrology device is operable as a level sensor or an alignment sensor.

\* \* \* \* \*